United States Patent [19]

Ibuchi et al.

[11] Patent Number: 5,084,725

[45] Date of Patent: Jan. 28, 1992

[54] PROCESS SPEED CONTROL DEVICE FOR IMAGE FORMATION

[75] Inventors: Yoshiaki Ibuchi, Nara; Koichi Eto, Yamatokoriyama, both of Japan

[73] Assignee: Sharp Kabushiki Kaisha, Osa Ka, Japan

[21] Appl. No.: 602,718

[22] Filed: Oct. 24, 1990

[30] Foreign Application Priority Data

Oct. 27, 1989 [JP] Japan .................................. 1-281086

[51] Int. Cl.$^5$ ........................................... G03B 27/52
[52] U.S. Cl. ................................................... 355/27
[58] Field of Search ................. 355/311, 27, 100, 106, 355/28; 354/21; 346/26 PH

[56] References Cited

U.S. PATENT DOCUMENTS

| | | | |
|---|---|---|---|
| 4,714,943 | 12/1987 | Sakakibara et al. | 355/27 |
| 4,736,215 | 4/1988 | Hudspeth et al. | 354/21 |
| 4,783,376 | 11/1988 | Sakaki et al. | 428/511 |
| 4,872,033 | 10/1989 | Watanabe et al. | 355/27 |
| 4,879,566 | 11/1989 | Hanabusa | 346/76 PH |

FOREIGN PATENT DOCUMENTS 1-182853 7/1989 Japan .

Primary Examiner—L. T. Hix
Assistant Examiner—D. Rutledge
Attorney, Agent, or Firm—David G. Conlin; Donald Brown

[57] ABSTRACT

A speed control device used in an image forming apparatus which includes a detector for checking whether the backing of an image receiving sheet is made of ordinary paper or OHP film, and is capable of controlling the rotating speeds of the motors depending upon the type of the image receiving sheet, i.e., an ordinary paper type or an OHP film type, thereby ensuring that the thermoplastic resin is molten to achieve optimum fluidity irrespective of the type of image receiving sheet.

1 Claim, 3 Drawing Sheets

PROCESS SPEED CONTROL DEVICE FOR IMAGE FORMATION

BACKGROUND OF THE INVENTION

1. Field of the Invention

The present invention relates generally to an image forming apparatus, and more particularly, to a process speed control device used in an image forming apparatus of the type which forms an image by transferring a dye image onto an image receiving sheet of ordinary paper or OHP (film for overhead projector) coated with a thermoplastic resin, and heating the receiving sheet so as to melt the thermoplastic resin coat thereon until the molten coat covers the receiving sheet so as to enable the dye image thereon to be glossy.

2. Description of the Prior Art

An image forming apparatus is known which forms an image by superimposing a photosensitive sheet containing microcapsules encapsulating light-curable agents and a coloring dye on an image receiving sheet coated with a thermoplastic resin and a developer for developing the dye. When the photosensitive sheet is exposed to light, such as light reflected from a document, the microcapsules are selectively cured by the light, thus forming a latent image. The image receiving sheet is then superposed on the latent image portions and is pressed against them. Under the pressure uncured capsules are caused to rupture, thereby enabling the dyes inside to flow out over the image receiving sheet. The dye reacts with the developer, and forms a dye image on the image receiving sheet. Then, by heating the image receiving sheet on which the dye image is formed, the thermoplastic resin applied to the surface of the image receiving sheet is melted until a molten dye covers the surface of the image receiving sheet, thereby enabling the image receiving sheet to be glossy.

Irrespective of whether the backing of the image receiving sheet may be ordinary paper or OHP film, the process is conducted at the same speed. However, because of the different thermal capacity between ordinary paper and the OHP film, the OHP film is liable to insufficient heating when the receiving sheets using ordinary paper and OHP film are heated while they are being conveyed at the same speed, thereby resulting in insufficient softening or melting of the thermoplastic resin. This causes fatal white spots on the surface of the image receiving sheet.

SUMMARY OF THE INVENTION

The speed control device used in the image forming apparatus, of this invention, which overcomes the above-discussed and numerous other disadvantages and deficiencies of the prior art, to be provided in an image forming apparatus wherein a dye image is transferred onto an image receiving sheet coated with a thermoplastic resin, the transferred dye image being made glossy by being coated with a molten thermoplastic resin, the speed control device comprises means for detecting whether the backing of the image receiving sheet is made of ordinary paper or OHP film; and means for slowing down the conveying of the image receiving sheet at a heating stage when it is detected that the backing of the image receiving sheet is OHP film.

In a preferred embodiment, the type of the image receiving sheet is detected by a light transmission sensor which comprises a light emitting element and a light receiving element so as to detect the amount of light passing through the image receiving sheet.

Thus, the invention described herein makes possible the objectives of (1) controlling the image forming speed depending upon whether the backing of the image receiving sheet is ordinary paper or OHP film; and (2) preventing white spots from occurring on the image receiving paper by constantly imparting adequate heat to the image receiving sheet.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 3:
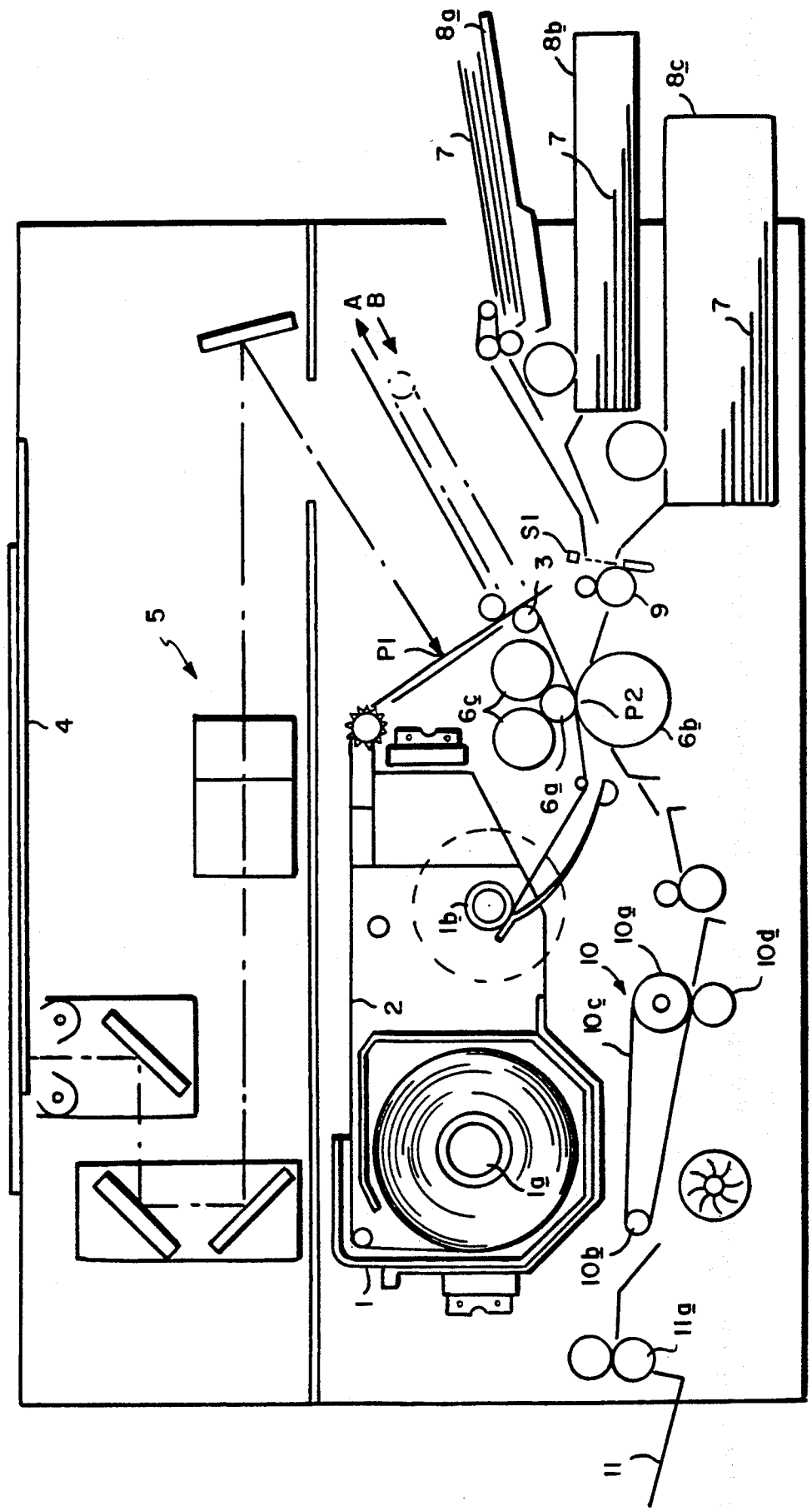
FIG. 3 is a schematic front view of a copying machine using an image receiving sheet.

Referring to FIG. 3, a media cartridge 1 is detachably mounted at one side in the copying machine. The media cartridge 1 is provided with a supply shaft 1a and a take-up shaft 1b, a fresh photosensitive sheet 2 being wound around the supply shaft 1a. The photosensitive sheet 2 is drawn out of the media cartridge 1 and is wound around the take-up shaft 1b via an exposure section P1, a buffer roller 3, a pressure developing section P2.

The buffer roller 3 is movable in directions shown by the arrows A and B in FIG. 3. When the buffer roller 3 is moved in the direction of the arrow A, the photosensitive sheet 2 is drawn out from around the supply shaft 1a for exposure at the exposure section P1 to light reflected from a document, which will be described hereinafter, thus forming a latent image thereon. At the end of the exposure process at the exposure section P1, the buffer roller 3 is moved in the direction of the arrow B to deliver the exposed photosensitive sheet to the pressure developing section P2 and then to the take-up shaft 1b. At the pressure developing section P2, an image receiving sheet (described hereinafter) is superposed on the photosensitive sheet 2 bearing the latent image, and pressed together between a pair of pressure rollers 6a and 6b. The reference numeral 6c denotes backup rollers for applying uniform pressure to the pressure rollers 6a and 6b along the axial length thereof.

On the top surface of the copying machine, a platen 4 of transparent glass on which a document to be copied is placed. Disposed beneath the platen 4 is an optical system 5 comprising a light source, mirrors, and a lens, the optical system 5 scanning the document placed on the platen 4 and directs the reflected light to the exposure section P1. Paper cassettes 8a-8c holding image receiving sheets 7 therein are mounted in an opposite side to the media cassette 1. During the image forming operation, an image receiving sheet 7 is fed to the pressure developing section P2 from one of the paper cassettes 8a-8c. The image receiving sheet 7 fed from one of the paper cassettes 8a-8c is stopped by PS rollers 9 disposed before the pressure developing section P2. The PS roller 9 starts to rotate at a predetermined timing after completion of the exposure process, so that the image receiving sheet 7 is superposed on the photosensitive resin sheet bearing the latent image traveling from the buffer roller 3.

There is provided a sensor S1 before the PS roller 9, so as to inspect the image receiving sheet. The sensor S1 is a light-transmission type photosensor which comprises a light emitting element and a light receiving element facing each other across the image receiving sheet's path. The sensor S1 detects the amount of light transmitted through an image receiving sheet fed from one of the paper cassettes so as to detect whether the backing of the image receiving sheet is ordinary paper or OHP film, on the basis of the amount of the detected transmission light which decreases when the backing is ordinary paper, and increases when it is OHP film.

Figure 2:
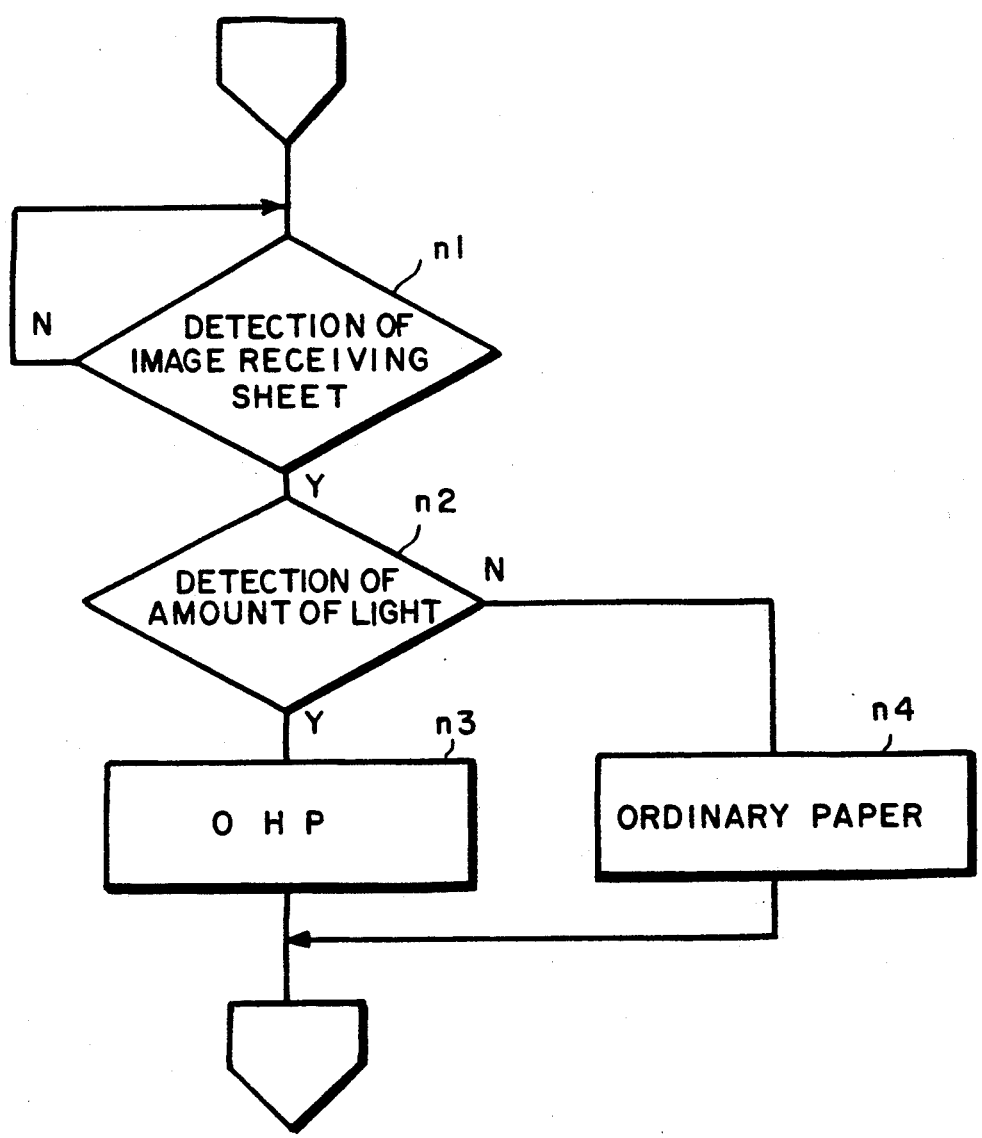

FIG. 2 is a flowchart showing a series of steps for detecting the type of an image receiving sheet. The sensor S1 detects the amount of light transmitted through the image receiving sheet, so as to ascertain whether the backing is OHP film or ordinary paper. When it detects a large amount of light transmission, it decides that the backing is OHP film as shown by steps n1→n2→n3. When it detects a small amount of light transmission, it decides that the backing is ordinary paper as shown by step n4.

As previously mentioned, the image receiving sheet 7 is superposed on the photosensitive sheet bearing the latent image, and pressed together at the pressure developing section P2. The pressure causes uncured microcapsules to rupture, thereby enabling the dye inside to flow out onto the image receiving sheet 7. The dye reacts with the developer on the image receiving sheet to give colors and form a dye image on the image receiving sheet. The image receiving sheet 7 bearing the dye image is passed through a heater unit 10, during which travel the image becomes glossy. Then, the image receiving sheet 7 is discharged by means of paper discharge rollers 11a onto a paper discharge tray 11 mounted on the same side as the media cassette 1.

The heater unit 10 has a heat roller 10a of metal housing a halogen tungsten lamp or the like, a tension roller 10b disposed downstream of the heat roller 10a, a heat resistant gloss-imparting belt 10c stretched between the heat roller 10a and the tension roller 10b, and a pressure roller 10d pressed against the heat roller 10a with the gloss imparting belt 10c interposed therebetween. Usually, the surface of the heat roller 10a is heated to about 160° C. First, the image receiving sheet 7 having the dye image transferred is fed on the gloss-imparting belt 10c, and pressed between the heat roller 10a and the pressure roller 10d, thereby softening the thermoplastic resin on the image receiving sheet until it covers the surface of the image receiving sheet. Then, the image receiving sheet 7 is further transported downstream along the gloss-imparting belt 10c. As the image receiving sheet 7 is getting away from the heat roller 10a, it cools down, and finally separated from the gloss-imparting belt 10c at the position of the tension roller 10b. Since the thermoplastic resin on the surface of the image receiving sheet 7 sufficiently cools and becomes hard, the thermoplastic resin is not likely to adhere to the surface of the gloss-imparting belt 10c.

The pressure rollers 6a and 6b, the heating unit 10, the paper discharge rollers 11a, etc., are driven by a main motor (not shown), and the buffer roller 3 is driven by a buffer roller motor (not shown). The rotating speeds of these motors decide the image forming speed; that is, the image forming speed can be increased and decreased by increasing and decreasing the speeds of these motors, depending upon whether the backing of the image receiving sheet is ordinary paper or OHP film. More specifically, when the image receiving sheet is heated by the heater unit 10, various heating conditions are achieved depending upon the rotating speeds of the motors. If the rotating speeds are reduced, the contact between the image receiving sheet 7 lasts longer than when the rotating speeds are increased, thus assuring sufficient heating over the OHP film backing. On the other hand, if the motor speeds are increased, the contact between the heater unit 10 and the image receiving sheet becomes shorter to the extent that the ordinary paper is heated sufficiently. When the heating temperature is about 160° C., the heating speed should be set preferably at 11.67 mm/sec for the OHP film type image receiving sheet and 31.5 mm/sec for the ordinary paper type image receiving sheet.

Figure 1:
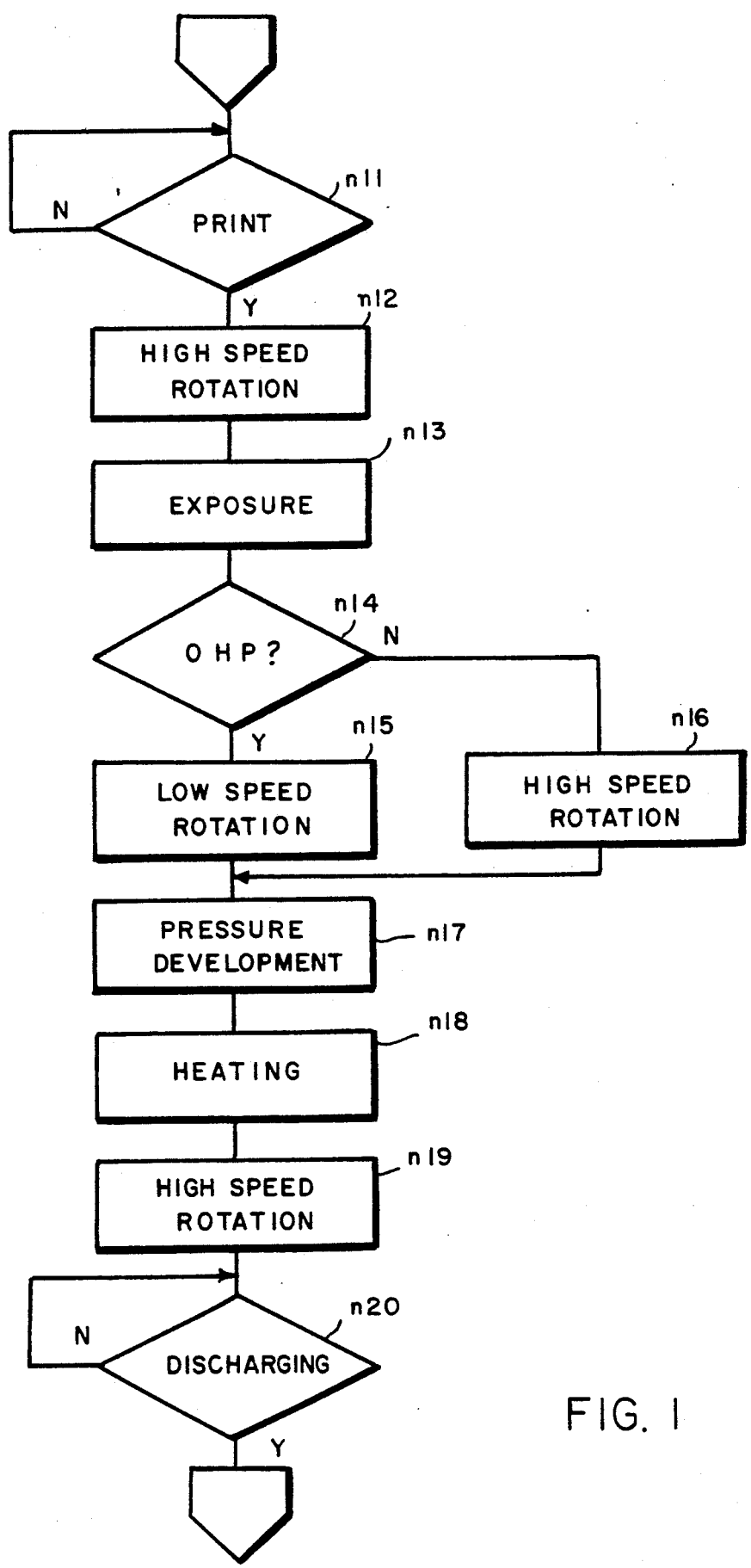
FIG. 1 and FIG. 2 are flowcharts showing procedures for controlling the processing speed of image formation and for judging the type of the image receiving sheet, respectively, according to the present invention.

With the illustrated copying machine, it is possible, depending on the size of the image receiving sheet, that the pressure developing process by the pressure developing section P2 is performed simultaneously with the heating process by the heater unit 10. This occurs when the leading edge of the image receiving sheet has reached the heater unit 10 while the trailing edge thereof is still in the pressure developing section P2. In such a case, it is extremely difficult to set the motor speeds differently between the pressure developing process and the heat treating process. Therefore, in this embodiment, the pressure developing process and the heating treating process are carried out as one combined process, the motor speeds being increased or decreased for that combined process. FIG. 1 is a flowchart showing a series of steps for carrying out the process.

When the print switch is turned on, the motor is started, and the exposure process is performed. The steps advance from steps n11→n12→n13. The motor speed at this time is set at a speed suitable for the exposure process regardless of the type of the image receiving sheet. After completion of the exposure process, the type of the image receiving sheet fed from the paper cassette is checked to see if it is OHP film or ordinary paper at step n14. When it is OHP film, the rotation of each motor is set to a slow speed at step n15. If it is an ordinary paper, the rotation of each motor is set to a fast speed at step n16. The pressure developing process and the heat treating process are performed at steps n17 and n18, respectively, and in the case of the OHP film, the motors run at slow speeds as set at step n15, taking sufficient time to heat the image receiving sheet 7. This eliminates the possibility of forming fatal white spots on the surface of the image receiving sheet 7. In the case of the ordinary paper, the motors run at fast speeds as set at step n16, thus shortening the heating time. After completion of the heating process, the motors are switched to an optimum speed at which the image receiving sheet 7 is discharged from the copying machine.

In the illustrated embodiment, the image forming speed is varied by changing the rotating speeds of the motors, but it is possible that the image forming apparatus may be so constructed that the processing speed is changed by means of a speed change gear.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A speed control device used in an image forming apparatus in which a dye image is transferred onto an image receiving sheet coated with a thermoplastic resin, the transferred dye image being made glossy by being coated with a molten thermoplastic resin, the speed control device comprising a light transmission sensor which comprises a light emitting element and a light receiving element so as to detect the amount of light passing through the image receiving sheet, and means for slowing down the conveying of the image receiving sheet at a heating stage when it is detected that the backing of the image receiving sheet is an OHP film.

* * * * *